(12) United States Patent
Wittrodt

(10) Patent No.: US 6,216,243 B1
(45) Date of Patent: Apr. 10, 2001

(54) PERMANENT FAILURE MONITORING IN COMPLEX SYSTEMS

(75) Inventor: Peter Wittrodt, Boeblingen (DE)

(73) Assignee: Hewlett-Packard, Palo Alto, CA (US)

( * ) Notice: Subject to any disclaimer, the term of this patent is extended or adjusted under 35 U.S.C. 154(b) by 0 days.

(21) Appl. No.: 09/050,505

(22) Filed: Mar. 30, 1998

(30) Foreign Application Priority Data

May 28, 1997 (EP) .................................................. 97108614
Jul. 18, 1997 (EP) .................................................. 97112332

(51) Int. Cl.$^7$ ............................. G01R 31/28; G06F 11/00
(52) U.S. Cl. ........................... 714/734; 714/733; 714/30; 702/121
(58) Field of Search .................................... 714/734, 742, 714/724, 25, 733, 30, 47, 46, 26; 702/121; 324/73

(56) References Cited

U.S. PATENT DOCUMENTS

| | | | |
|---|---|---|---|
| 4,807,161 | * | 2/1989 | Comfort et al. ...................... 702/121 |
| 5,081,598 | * | 1/1992 | Bellows et al. ...................... 364/550 |
| 5,127,009 | * | 6/1992 | Swanson .............................. 714/734 |
| 5,202,639 | * | 4/1993 | McKeon et al. ...................... 324/537 |
| 5,544,308 | * | 8/1996 | Giordano et al. ...................... 714/26 |
| 5,566,092 | * | 10/1996 | Wang et al. ..................... 364/551.02 |
| 5,663,656 | * | 9/1997 | Wilson et al. ...................... 324/763 |
| 5,734,567 | * | 3/1998 | Griffiths et al. ..................... 364/184 |

* cited by examiner

Primary Examiner—Albert Decady
Assistant Examiner—Shelly A Chase

(57) ABSTRACT

Described is a system with a plurality of subsystems, wherein at least one of the plurality of subsystems comprises one or more monitoring points relevant and representative for certain parameters of the respective subsystem, each one of the one or more monitoring points is connected with a respective diagnosis module for substantially permanently monitoring the respective monitoring point, and an evaluation unit is connected with each respective diagnosis module for receiving information therefrom about each respective monitoring point, and for evaluating the received information in order to draw conclusions about parameters and properties within the system. The system is preferably used in an automated test equipment system.

12 Claims, 1 Drawing Sheet

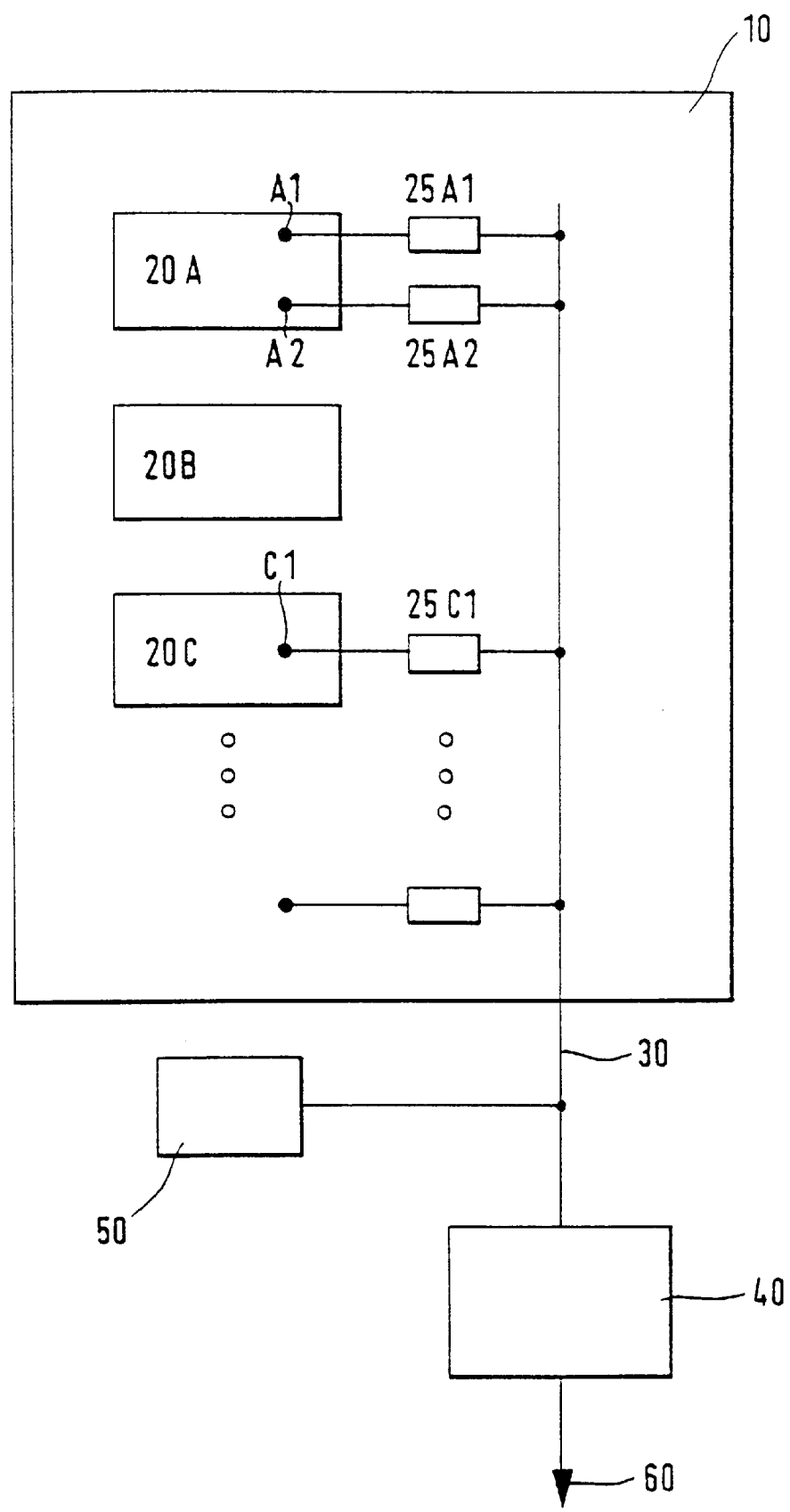

PERMANENT FAILURE MONITORING IN COMPLEX SYSTEMS

BACKGROUND OF THE INVENTION

The present invention generally relates to the discovering of failures in complex systems for data processing purposes.

Discovering of failures in complex systems, i.e. systems with a plurality of subsystems, generally exhibits difficulties since there might be a plurality of difficult failures in the various subsystems, and the failures might also reveal in different forms. Failures which can obviously be seen, such as when a system is completely inoperable, can easily be detected by the user of the system. However, in case that internal parameters within the system or the subsystems change and thus influence the entire system, this might not be detected from outside, e.g., by the user. These failures might only turn out by their effects and can solely be detected by trained users, special instructed persons, or by sp cific inspection routines.

Some failures occurring in one subsystem only have an impact on the subsystem itself e.g. in a way that only the subsystem might become inoperable. However, other failures occurring in one subsystem might also influence other s bsystems and thus the entire system.

Examples for systems which are in particular sensitive for failures are automated test equipment (ATE) systems, such as IC testers, or sorting and packaging machines with optical recognition of products, or the like. Defects or failures in one subsystem can influence the entire ATE system in a way that the testing results can be erroneous and might not represent the actual state of a device under test (DUT). This can lead to a reduced yield of the DUTs to be tested and components which are well functioning might be selected as defective, and vice versa.

Failures in complex systems are usually detected in the art by specific diagnosis routines monitoring the functional ability (functionability) of the system. The diagnsis routines are normally started in defined service or maintenance intervals, or before use of the system. The execution of such a diagnosis routine is to be started by the user or might be automatically and periodically started by the system. The effective using time of the system is reduced by the time required for executing the diagnosis routines. In case the system is used for production or testing purposes, the time required for executing the diagnosis routines might increase the product costs of the devices to be produced or tested by the system. Furthermore, failures occurring during the operation of the system might not be recognized and can lead to a series of faulty products.

SUMMARY OF THE INVENTION

It is an object of the present invention to improve the detection of failures occurring in complex systems.

According to the invention, a complex system is monitored substantially permanently at p edefined monitoring points by means of one or more diagnosis modules respectively within one or more subsystems of the system. The diagnosis modules provide their measuring results to an evaluation unit for evaluating define d parameters and properties of the subsystem and thus of the system.

The term 'substantially permanently monitoring' as used herein means that the monitoring is exe uted substantially in parallel to and independent of other running programs events, tasks, or the like within the system. However, the monitoring and evaluating according to the invention might also be run with a lower or higher priority that other running programs or tasks within the system in order to improve possible runtime constraints within the system. In case that the entire system or respective subsystems are operated in a standby mode, the monitoring is preferably carried on, whereas in case that the entire system or respective subsystems are switched of or in a disconnected mode, the monitoring within the entire system or the respective subsystems is preferably not maintained and also switched of or disconnected. For that reason, the monitoring is preferably driven by an own separate power supply.

A system according to the invention comprises a plurality of subsystems, whereby at least on of the plurality of subsystems comprises one or more monitoring points reevant and representative for certain parameters of the respective subsystem and each one of the one or more monitoring points is connected with a respective diagnosis module for substantially permanently monitoring the respe ve monitoring point An evaluation unit is connected with each respective diagnosis module for receiving information therefrom about each respective monitoring point and for evaluating the received information in order to draw back onto parameters and properties within the system.

A method according to the invention for discovering failures in the system according to the invention comprises steps of substantially permanently monitoring the respective monitoring point, receiving information from each respective diagnosis module about each respective monitoring point, and evaluating the received information in order to draw back onto parameters and properties within the system.

The invention is preferably used in an automated test equipment system.

The predefined monitoring points have to be selected as relevant and representative for the functionality of a respective subsystem and thus of the functionality of the entire system. The diagnosis modules are preferably coupled by a communication channel connecting the respective diagnosis modules with the evaluation unit.

The evaluation unit is preferably controlled by a software program which is executed substantially permanently and in parallel to other running programs or tasks within the system.

The invention allows to permanently monitor and observe parameters of the system without unduly influencing the usage of the system. In case of a failure occurring or when observed parameters of the system tend to drift, the user of the system can be informed by the evaluation unit during the normal operation of the system.

The invention further allows to postpone or suspend an intended inspection cycle of the system in case that no drifting of parameters or that no failures are observed by the evaluation unit. This leads to increased inspection intervals of the system and thus to an increased effective using time of the system and decreased expenditure for maintaining and inspecting the system.

The reliability of the system and of working results from the systems can thus be significantly improved.

Particularly in ATE systems, the invention allows to reliably carry out the respective testing. The monitoring points have to be carefully selected in order to draw conclusions about the tests to be performed.

BRIEF DESCRIPTION OF THE DRAWINGS

Other objects and many of the attendant advantages of the present invention will be readily appreciated and become better understood by reference to the following detailed description when considering in connection with the accompanied drawing, in which:

FIG. 1 shows an implementation of the invention in an ATE system.

DETAILED DESCRIPTION OF THE INVENTION

FIG. 1 shows an implementation of the invention in an ATE system 10. The system 10 comprises a plurality of subsystems 20A, 20B, 20C, etc. In an IC tester application, the subsystems 20A, 20B, 20C, etc. might be for example a cooler, a power control circuit, a clock generation circuit, etc.

Each one of the subsystems 20A, 20B, 20C, etc. might comprise one or more monitoring points relevant and representative for certain parameters of the respective subsystem. In the example of FIG. 1, subsystem 20A comprises a first monitoring point A1 and a second monitoring point A2. Subsystem 20B comprises no monitoring points, whereas subsystem 20C comprises one monitoring point C1. It is to be understood that the number of monitoring points within one subsystem depends as well on the function and complexity of this respective subsystem as on the function of the subsystem within the entire system 10.

Each one of the monitoring points A1, A2, C1, etc. is connected with a respective diagnosis module 25A1, 25A2, 25C1, etc. for substantially permanently monitoring the respective monitoring point. Each respective diagnosis module generally works independently of other diagnosis modules. If the system 10 breaks down, the diagnosis modules 25A1, 25A2, 25C11 etc. are preferably maintained functional. The respective diagnosis module 25A1, 25A2, 25C1, etc. are also able to communicate and to share data amongst each other.

In case the system 10 represents an IC tester and the subsystems might be a cooler, power control circuit, clock generation circuits, etc., the respective monitoring points might represent water temperature and pressure, primary and secondary voltages, clock frequencies and bus terminations, etc.

Turning again to FIG. 1, the diagnosis module 25A1, 25A2, 25C1, etc. (and thus the monitoring points A1, A2, C1, etc.) are connected via a communication channel 30 with an evaluation unit 40. The evaluation unit 40 might be part of the system 10 or separated therefrom as an independent unit. The evaluation unit 40 is preferably controlled by a software program which permanently monitors the monitoring points A1, A2, C1, etc. by requesting andlor automatically receiving data therefrom.

In a preferred embodiment, each one of the respective diagnosis modules 25A1, 25A2, 25C1, etc. periodically signals in predetermined time intervals via the communication channel 30 whether the diagnosis module is still operable or not. The evaluation unit 40 and each other functional unit connected with the communication channel 30 receive the 'alive signals' from the respective diagnosis modules 25A1, 25A2, 25C1, etc. and can draw conclusions therefrom. In case of a complete or partial in-operability of one diagnosis module, the evaluation unit 40 will signal this event to the user of the system 10.

In a preferred embodiment, the diagnosis module 25A1, 25A2, 25C1, etc. comprise respective micro-controllers (uC) which control the hardware implementation of the monitoring points A1, A2, C1, etc. The respective microcontrollers are also responsible for the communication and sharing of data between the diagnosis modules 25A1, 25A2, 25C1, etc. of the subsystems 20A, 20B, 20C, etc. The microcontrollers of each diagnosis module might also check if the other diagnosis modules in the system 10 are still functional by using a given communication protocol.

In case that the system 10 represents an IC tester and the subsystems might be a cooler, power control circuit, clock generation circuits, etc., and the respective monitoring points might represent water temperature and pressure, primary and secondary voltages, clock frequencies and bus terminations, etc., the respective diagnosis module 25A1, 25A2, 25C1, etc. might for example measure the water temperature and pressure in respective water circuit loops, measure voltages and currents needed by the different hardware subsystems, and measure clock signals which are distributed in the whole system.

The communication channel 30 can be implemented as an industrial standard bus such as a controller area network (CAN). This allows a low cost, reliable and simple implementation of the communication channel 30. Since most PCs or workstation computers are generally not equipped with a CAN interface, the communication with and between the respective diagnosis module 25A1, 25A2, 25C1, etc. can be controlled by a specific communication controller 50 which might be part of the evaluation unit 40 or the system 10. The communication controller 50 might transmit the respective data via a standard RS 232 interface.

The respective components for monitoring the system 10, such as the monitoring points A1, A2, C1, etc., the diagnosis modules 25A1, 25A2, 25C1, etc., and the evaluation unit 40, are substantially independent of other functional units within the system 10 and thus only influence the system 10 to a minimum degree.

In a preferred embodiment, the evaluation unit 40 comprises a (not shown) signaling unit for emitting a signal on a line 60 in case that the evaluation unit 40 observes that a failure is occurring or when an observed parameter of the system 10 tends to drift.

A detailed example of a preferred embodiment is given the following, wherein the system 10 represents an IC-tester and the subsystem 20A is embodied as a power controlling circuit. The monitoring point A1 might be an external analog to digital converter (ADC) which is controlled by a micro controller (uC) within the diagnosis module 25A1 for measuring the primary voltage of the system 10. The monitoring point A2 is a test point for measuring a termination voltage of a communication bus within the system 10. The monitoring point A2 is directly connected with the internal ADC of the uC located in the diagnosis module 25A2.

The subsystem 20C is embodied as a cooler and the diagnosis module 25C1 (temperature sensor) monitors a water temperature at the monitoring point C1. The signal delivered from the monitoring point C1 is fed to the uC implemented in the diagnosis module 25C1. All micro controllers located within the diagnosis modules 25A1, 25A2 and 25C1 are connected with the communication controller 50 using a CAN network. The communication controller 50 is connected to the evaluation unit 40 (Unix workstation or PC) using an RS232 interface.

If the termination voltage measured at the monitoring point A2 by the diagnosis module 25A2 changes and violates an upper or lower voltage limit, the failure is reported to the other diagnosis modules 25A1, 25C1 and to the communication controller 50 which transmits the failure condition to the evaluation unit 40. The diagnosis modules 25A1 and 25C1 get the values (primary voltage, water temperature) from their monitoring points A1 and C1 and then latch this information. All data will then be requested by the evaluation unit 40 for reconstruction and evaluating the failure condition. The failure is then reported to the user of the IC-tester by emitting a signal on line 60.

What is claimed is:

1. An automated test equipment system for testing a system with a plurality of subsystems, wherein:

the plurality of subsystems include one or more monitoring points for monitoring and manifesting certain parameters of the respective subsystem;

a plurality of diagnosis modules, each diagnosis module operationally independent of other of said diagnosis modules so as to remain operative in the event of a malfunction thereof, said diagnosis modules further coupled so as to enable communications therebetween at least upon an occurrence of an event;

each one of the one or more monitoring points connected with a respective diagnosis module to enable each said respective diagnosis module to substantially permanently monitor the respective monitoring point for said parameters manifested thereby; and an evaluation unit connected with each respective diagnosis module for receiving information therefrom about each respective monitoring point, and for evaluating the received information in order to draw conclusions about parameters and properties within the system.

2. The system according to claim 1, wherein each one of the one or more monitoring points manifests a parameter that is representative of the functionality of at least one of the respective subsystems or of the functionality of the entire system.

3. The system according to claim 1, wherein each respective diagnosis module is coupled by a communication channel with the evaluation unit.

4. The system according to claim 1, wherein the evaluation unit is controlled by a software program which is executed substantially permanently and in parallel to other running programs or tasks within the system.

5. The system according to claim 1, wherein the evaluation unit comprises a signaling unit for signaling in case that the evaluation unit observes a failure occurring or when an observed parameter of the system tends to drift.

6. The system according to claim 1, wherein said diagnosis modules periodically dispatch signals, monitored by at least one of said evaluation unit or said diagnosis modules, that indicate that the respective diagnosis modules are alive and functional.

7. The system according to claim 1, wherein the event is an occurrence of a measured parameter reaching a predetermined limit condition.

8. A method for discovering failures in a system with a plurality of subsystems, wherein at least one of the plurality of subsystems comprises one or more monitoring points for monitoring and manifesting certain parameters of the respective subsystems, a plurality of diagnosis modules, each diagnosis module operationally independent of other of said diagnosis modules so as to remain operative in the event of a malfunction thereof, said diagnosis modules further coupled so as to enable communications therebetween at least upon an occurrence of an event, and an evaluation unit connected with each respective diagnosis module; the method comprising the steps of:

operating said diagnosis modules to substantially permanently monitor the respective monitoring points for parameters manifested thereby;

receiving information from each respective diagnosis module about each respective monitoring point, and controlling the evaluation unit with a software program that is executed substantially permanently and in parallel to other running programs or tasks within the system so as to enable evaluation of the received information in order to draw conclusions about parameters and properties within the system.

9. The method according to claim 8 comprising a step of signaling in case that the evaluation unit observes that a failure is occurring or when an observed parameter of the system tends to drift.

10. The method according to claim 8, wherein the event is an occurrence of a measured parameter reaching a predetermined limit condition.

11. The method according to claim 8, further comprising the steps of:

periodically dispatching signals from each respective diagnosis module that indicate that the respective diagnosis module is alive and functional; and monitoring said dispatched signals at least one of said evaluation unit or said diagnosis modules.

12. An automated test equipment system for testing a system with a plurality of subsystems, wherein:

the plurality of subsystems include one or more monitoring points for monitoring and manifesting certain parameters of the respective subsystem;

a plurality of diagnosis modules, each diagnosis module operationally independent of other of said diagnosis modules so as to remain operative in the event of a malfunction thereof, said diagnosis modules further coupled so as to enable communications therebetween, and wherein said diagnosis modules periodically dispatch signals, monitored by at least one of said evaluation unit or said diagnosis modules, that indicate that the respective diagnosis modules are alive and functional;

each one of the one or more monitoring points connected with a respective diagnosis module to enable each said respective diagnosis module to substantially permanently monitor the respective monitoring point for said parameters manifested thereby; and an evaluation unit connected with each respective diagnosis module for receiving information therefrom about each respective monitoring point, and for evaluating the received information in order to draw conclusions about parameters and properties within the system.

* * * * *